US010269500B2

(12) United States Patent
Hayakawa

(10) Patent No.: US 10,269,500 B2
(45) Date of Patent: Apr. 23, 2019

(54) CIRCUIT MODULE

(75) Inventor: Masashi Hayakawa, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 482 days.

(21) Appl. No.: 13/526,681

(22) Filed: Jun. 19, 2012

(65) Prior Publication Data

US 2012/0257323 A1    Oct. 11, 2012

Related U.S. Application Data

(63) Continuation of application No. PCT/JP2010/071545, filed on Dec. 2, 2010.

(30) Foreign Application Priority Data

Dec. 24, 2009   (JP) .................. 2009-291690

(51) Int. Cl.
*H05K 1/16*    (2006.01)
*H01G 4/30*    (2006.01)
(Continued)

(52) U.S. Cl.
CPC ............. *H01G 4/385* (2013.01); *H01G 4/232* (2013.01); *H01G 4/30* (2013.01);
(Continued)

(58) Field of Classification Search
CPC ....... H01L 2224/16; H01L 2924/01078; H01L 2924/14; H01L 23/5389;
(Continued)

(56) References Cited

U.S. PATENT DOCUMENTS 6,611,419 B1 *  8/2003  Chakravorty ..... H01L 23/49822
                                                    257/E23.062
2006/0139849 A1   6/2006  Yoon et al.
(Continued)

FOREIGN PATENT DOCUMENTS

CN       1794389 A      6/2006
CN       101336461 A   12/2008
(Continued)

OTHER PUBLICATIONS

Official Communication issued in corresponding Chinese Patent Application No. 201080058300.5, dated Dec. 31, 2014.
(Continued)

*Primary Examiner* — Eric W Thomas
*Assistant Examiner* — Arun Ramaswamy
(74) *Attorney, Agent, or Firm* — Keating & Bennett, LLP

(57) ABSTRACT

A circuit module includes a multilayer substrate including built-in capacitors and external components mounted on the surface of the multilayer substrate. On the surface of a dielectric layer, an auxiliary electrode is provided. The auxiliary electrode is electrically connected to a capacitor electrode via a via electrode passing through the dielectric layer. On the surface of a dielectric layer, a capacitor electrode is arranged so as to face the capacitor electrode and the auxiliary electrode connected to the capacitor electrode. The auxiliary electrode is arranged in an area in which the capacitor electrodes overlap each other as viewed from a lamination direction.

8 Claims, 6 Drawing Sheets

(51) Int. Cl.
*H01L 49/02* (2006.01)
*H01G 4/38* (2006.01)
*H01L 23/498* (2006.01)
*H01L 23/64* (2006.01)
*H01L 25/16* (2006.01)
*H01G 4/232* (2006.01)
*H05K 3/46* (2006.01)

(52) U.S. Cl.
CPC ...... *H01L 23/49822* (2013.01); *H01L 23/642* (2013.01); *H01L 23/645* (2013.01); *H01L 25/16* (2013.01); *H05K 1/162* (2013.01); *H01L 2224/16225* (2013.01); *H05K 3/4611* (2013.01); *H05K 2201/0187* (2013.01); *H05K 2201/09672* (2013.01)

(58) Field of Classification Search
CPC ........... H01L 2924/19041; H01L 28/40; H01L 28/60; H05K 1/182; H05K 1/0231; H05K 1/141; H05K 1/16; H05K 1/162; H01G 4/30
USPC .................. 361/760, 761, 763, 301.4, 321.1; 174/260
See application file for complete search history.

(56) References Cited

U.S. PATENT DOCUMENTS

| | | | |
|---|---|---|---|
| 2006/0198079 A1* | 9/2006 | Shim | H01G 2/06 361/306.3 |
| 2006/0291177 A1 | 12/2006 | Choi et al. | |
| 2007/0217122 A1* | 9/2007 | Gevorgian et al. | 361/307 |
| 2007/0220725 A1 | 9/2007 | Borland | |
| 2008/0000061 A1 | 1/2008 | Jeong et al. | |
| 2008/0185179 A1* | 8/2008 | Kim | H05K 1/0236 174/265 |
| 2008/0254968 A1* | 10/2008 | Kakuda | C04B 35/465 501/137 |
| 2008/0297978 A1 | 12/2008 | Ohaga et al. | |
| 2009/0086451 A1* | 4/2009 | Kim | H05K 1/0218 361/762 |
| 2009/0266594 A1 | 10/2009 | Yoshikawa | |

FOREIGN PATENT DOCUMENTS

| | | | |
|---|---|---|---|
| JP | 6-302966 A | | 10/1994 |
| JP | 2002-280261 A | | 9/2002 |
| JP | 2002280261 A | * | 9/2002 |
| JP | 2005-39263 A | | 2/2005 |
| JP | 2005-210074 A | | 8/2005 |
| JP | 2006-196877 A | | 7/2006 |
| TW | 594812 B | | 6/2004 |
| WO | 2005062355 A1 | | 7/2005 |

OTHER PUBLICATIONS

Official Communication issued in International Patent Application No. PCT/JP2010/071545, dated Mar. 1, 2011.
Official Communication issued in corresponding European Patent Application No. 10839153.3, dated Jul. 6, 2015.
Official Communication issued in corresponding Chinese Patent Application No. 201080058300.5, dated May 6, 2014.

* cited by examiner

CIRCUIT MODULE

BACKGROUND OF THE INVENTION

1. Field of the Invention

The present invention relates to a circuit module that is included in a communication apparatus for use in a high-frequency band and includes a multilayer substrate including built-in capacitors.

2. Description of the Related Art

As communication apparatuses, such as mobile telephones, decrease in size and weight and increase in functionality, circuit elements embedded in these communication apparatuses have been reduced in size and increased in functionality. There is also an increasing demand for a compact and multifunctional circuit module including such a circuit element.

Each circuit module used in communication apparatuses, such as mobile telephones, is generally produced with a multilayer substrate including built-in capacitors. The multilayer substrate including built-in capacitors is obtained by laminating a plurality of functional layers. An active element and a passive element, which are required to form a circuit module, are mounted on each of the functional layers.

An example of such a circuit module is disclosed in Japanese Unexamined Patent Application Publication No. 2005-39263.

The configuration of the circuit module disclosed in Japanese Unexamined Patent Application Publication No. 2005-39263 will be described with reference to FIGS. 4, 5, and 6.

FIG. 4 is a cross-sectional view of a circuit module 100. The circuit module 100 includes a multilayer substrate 101 including built-in capacitors. The multilayer substrate 101 including built-in capacitors is obtained by laminating a plurality of functional layers.

FIGS. 5 and 6 are diagrams illustrating functional layers 106 and 107, respectively. FIG. 5 is a plan view of the functional layer 106 as viewed from the surface of the functional layer 106. On the surface of the functional layer 106, capacitor electrodes C13 to C16 and inductor electrodes L1 and L2 are formed. One end of the inductor electrode L1 is connected to the capacitor electrode C13, and the other end of the inductor electrode L1 is arranged close to the capacitor electrode C15. One end of the inductor electrode L2 is connected to the capacitor electrode C14, and the other end of the inductor electrode L2 is arranged close to the capacitor electrode C16.

FIG. 6 is a plan view of the functional layer 107 as viewed from the surface of the functional layer 107. On the surface of the functional layer 107, capacitor electrodes C131, C141, C151, and C161 are formed. The capacitor electrodes C131, C141, C151, and C161 face the capacitor electrodes C13, C14, C15 and C16, respectively, formed on the surface of the functional layer 106 via the functional layer 106, so that capacitors C3 to C6 are formed in the functional layer 106 that is a capacitor layer.

A design method of providing a good characteristic for a circuit module by adjusting the value of a capacitor in a circuit to an optimum value is often used.

For example, in the case of the multilayer substrate 101 including built-in capacitors in the circuit module 100, the area of the capacitor electrode C15 may be changed so as to adjust the capacitance value of the capacitor C5. In this case, however, since the inductor electrode L1 and the capacitor electrode C15 are close to each other on the same dielectric layer, the state of coupling between the inductor electrode L1 and the capacitor electrode C15 is also changed. In a case in which the thickness of the functional layer 106 is changed so as to change the capacitance value of the capacitor C5, the capacitance values of the other capacitors in the functional layer 106 that is a capacitor layer, that is, the capacitors C4, C5, and C6, are also changed.

Such a change in a capacitance value will be described with reference to FIGS. 7A and 7B. Referring to FIG. 7A, capacitor electrodes 1 and 2 face each other, so that a capacitor C1 is formed. An inductor electrode 3 is formed over the capacitor electrode 1, and a coupling capacitor C2 is formed between the inductor electrode 3 and the capacitor electrode 1. FIG. 7B is a diagram illustrating the change in the area of the capacitor electrode 1 which is performed so as to change the value of the capacitor C1. As illustrated in the drawing, the reduction in the area of the capacitor electrode 1 changes the value of the coupling capacitor C2 between the capacitor electrode 1 and the inductor electrode 3. Although not illustrated, in a case where the position of the capacitor electrode 2 in the lamination direction is changed so as to change the value of the capacitor C1, the value of the coupling capacitor C2 is also changed.

Thus, in a multilayer substrate including built-in capacitors in the related art, when the value of a single capacitor in the substrate is optimized, the state of coupling between a corresponding capacitor electrode and another circuit element in the substrate is also changed. Accordingly, it is necessary to change the overall design of the multilayer substrate.

SUMMARY OF THE INVENTION

To overcome the problems described above, preferred embodiments of the present invention provide a multilayer substrate including built-in capacitors in which the value of one of the capacitors can be independently adjusted without changing the state of coupling between a corresponding capacitor electrode and another circuit element and the values of the other ones of the capacitors.

A circuit module according to a preferred embodiment of the present invention preferably includes a multilayer substrate including at least one built-in capacitor. The multilayer substrate including at least one built-in capacitor includes a plurality of dielectric layers and a plurality of capacitor electrodes that are laminated to one another. A via electrode is provided between a pair of the plurality of capacitor electrodes defining the at least one capacitor.

In this case, only the capacitance value of a predetermined capacitor can be independently adjusted without affecting the state of coupling between a corresponding capacitor electrode and another circuit element and the other capacitors.

The via electrode preferably extends from one of the pair of the capacitor electrodes defining the at least one capacitor and is preferably directed towards the other one of the pair of the capacitor electrodes.

The circuit module preferably further includes an auxiliary electrode that is provided in an area between the pair of the capacitor electrodes overlapping each other as viewed from a lamination direction and is arranged parallel or substantially parallel to the lamination direction. The auxiliary electrode and the via electrode are preferably connected to each other.

In this case, by providing an auxiliary electrode, the capacitance value of a predetermined capacitor can be independently adjusted easily without affecting the state of coupling between a corresponding capacitor electrode and another circuit element and the values of the other capacitors.

The at least one capacitor is preferably a capacitor group including two or more capacitors defined by three or more of the plurality of capacitor electrodes. Adjacent capacitors in the capacitor group preferably share one of the plurality of capacitor electrodes.

In this case, only the capacitance value of a predetermined capacitor can be adjusted while efficiently configuring a plurality of capacitors.

For the three or more of the plurality of capacitor electrodes defining the capacitor group, a plurality of the via electrodes or a plurality of the auxiliary electrodes connected to the via electrodes are preferably provided.

In this case, by providing a plurality of via electrodes or a plurality of capacitors, the number of capacitors for which the adjustment of a capacitance value can be performed at the same time is increased. In a case in which a plurality of auxiliary electrodes is provided for a single capacitor, the design flexibility of a capacitance value is increased.

A circuit element other than the at least one capacitor is preferably provided on one of the plurality of dielectric layers.

According to various preferred embodiments of the present invention, a via electrode is provided for capacitor electrodes defining a capacitor in a multilayer substrate including built-in capacitors. Alternatively, a via electrode and an auxiliary electrode connected to the via electrode may be provided for the capacitor electrodes. As a result, only the capacitance value of the capacitor can be designed without affecting the state of coupling between each of the capacitor electrodes and another circuit element in the substrate and capacitors defined by the other capacitor electrodes in the substrate. This leads to the increase in design flexibility.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A circuit module according to preferred embodiments of the present invention that include a substrate including built-in capacitors will be described below with reference to the accompanying drawings.

First Preferred Embodiment

Figure 1:
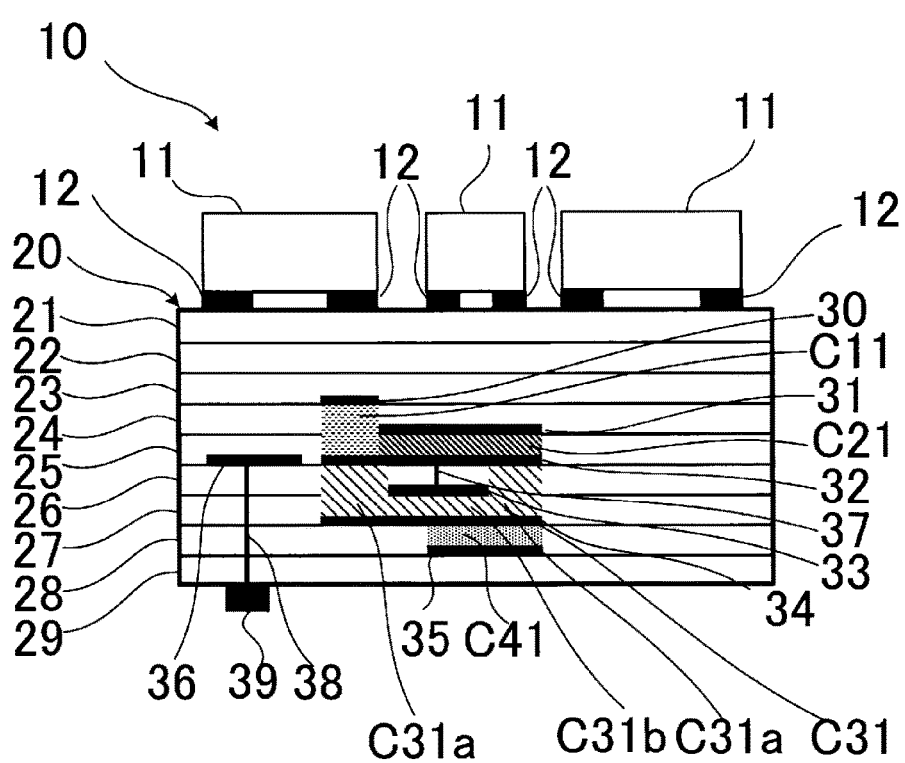
FIG. 1 is a cross-sectional view of a circuit module according to a first preferred embodiment of the present invention.

The configuration of a circuit module 10 according to a first preferred embodiment of the present invention is illustrated in FIG. 1. FIG. 1 is a cross-sectional view of the circuit module 10.

As illustrated in FIG. 1, the circuit module 10 preferably includes a multilayer substrate 20 including built-in capacitors and external components 11 mounted on the surface of the multilayer substrate 20. The external components 11 are connected to one of the main surfaces of the multilayer substrate 20 including built-in capacitors via mounting electrodes 12 disposed on the main surface of the multilayer substrate 20. For example, as the external component 11, a chip inductor, a laminated capacitor, a surface acoustic wave filter, or a diode is preferably selected in accordance with a desired function to be performed by the circuit module 10.

The multilayer substrate 20 including built-in capacitors is preferably defined by a laminate including a plurality of dielectric layers 21 to 29 made of ceramic or a resin, for example. Predetermined electrode patterns are provided on the surface and undersurface of the laminate and between the dielectric layers. With these electrode patterns, circuit elements, such as capacitors and inductors, and a transmission line to transmit signals are defined. Only electrode patterns related to a characteristic structure according to this preferred embodiment are illustrated in FIG. 1, and the illustration of the other electrode patterns is omitted.

Capacitor electrodes 30 and 31 are provided on the surfaces of the dielectric layers 24 and 25, respectively. On the surface of the dielectric layer 26 adjacent to the dielectric layer 25, a capacitor electrode 32 is provided. The capacitor electrode 32 faces the capacitor electrode 30 via the dielectric layers 24 and 25, so that a capacitor C11 is provided in an area filled in with large dots in FIG. 1. In addition, the capacitor electrode 32 faces the capacitor electrode 31 via the dielectric layer 25, so that a capacitor C21 (a dark shaded portion in FIG. 1) is provided.

An auxiliary electrode 33 is provided on the surface of the dielectric layer 27. The auxiliary electrode is connected to the capacitor electrode 32 via a via electrode 37 passing through the dielectric layer 26. On the surface of the dielectric layer 28, a capacitor electrode 34 is provided so as to face the capacitor electrode 32 and the auxiliary electrode 33 connected to the capacitor electrode 32. The auxiliary electrode 33 is arranged in an area in which the capacitor electrodes 32 and 34 face each other as viewed from the lamination direction.

The capacitor electrode 32 faces the capacitor electrode 34 via the dielectric layers 26 and 27 in an area in which there is no overlap between the capacitor electrode and the auxiliary electrode 33 as viewed from the lamination direction, so that a capacitor C31a is provided. On the other hand, in an area in which the capacitor electrode 32 and the auxiliary electrode 33 overlap each other, the auxiliary electrode 33 faces the capacitor electrode 34 via the dielectric layer 27, so that a capacitor C31b is provided. Accordingly, a capacitor C31 (a lightly shaded portion in FIG. 1) obtained by combining the capacitors C31a and C31b is provided between the capacitor electrodes 32 and 34.

On the surface of the dielectric layer 29, a capacitor electrode 35 is provided. The capacitor electrode 35 faces the capacitor electrode 34 via the dielectric layer 28, so that a capacitor C41 (an area filled in with small dots in FIG. 1) is provided.

An inductor electrode 36 is provided on the surface of the dielectric layer 26. The inductor electrode 36 is connected to an external electrode 39 provided on the other main surface of the multilayer substrate 20 including built-in capacitors via a via electrode 38 passing through the dielectric layers 26 to 29 in the lamination direction.

The inductor electrode 36 is capacitively coupled to the capacitor electrode 32 disposed close to the inductor electrode 36 in the dielectric layer 26. In addition, the inductor electrode 36 is capacitively coupled to the edge of the capacitor electrode 34 in the lamination direction.

In the present preferred embodiment, since the auxiliary electrode 33 to which the capacitor electrode 32 is electrically connected via the via electrode 37 is provided, the value of the capacitor C31 can be adjusted by changing the area of the auxiliary electrode. The value of the capacitor C31 can also be adjusted by changing the thicknesses of the dielectric layers 26 and 27 to change the position of the auxiliary electrode 33 in the lamination direction. More specifically, the value of the capacitor C31 can be adjusted by changing the thicknesses of the dielectric layers 26 and 27 while maintaining the distance between the capacitor electrodes 32 and 34.

Thus, the value of the capacitor C31 can be adjusted without changing the area of the capacitor electrode 32 or 34 and the position of the capacitor electrode 32 or 34 in the lamination direction. Accordingly, the value of the capacitor C31 can be adjusted independently of the values of the capacitors C11 and C21 defined by the capacitor electrode 32 and the capacitor C41 defined by the capacitor electrode 34. Since the area of the capacitor electrode 32 or 34 and the position of the capacitor electrode 32 or 34 in the lamination direction are not changed, the state of capacitive coupling between the capacitor electrode and the inductor electrode 36 is also not changed.

As described previously, by providing an auxiliary electrode connected to a capacitor electrode via a via electrode, it is possible to independently adjust only the capacitance value of a predetermined capacitor without affecting the state of coupling between the capacitor electrode and another element and the capacitance values of the other capacitors.

Second Preferred Embodiment

Figure 2:
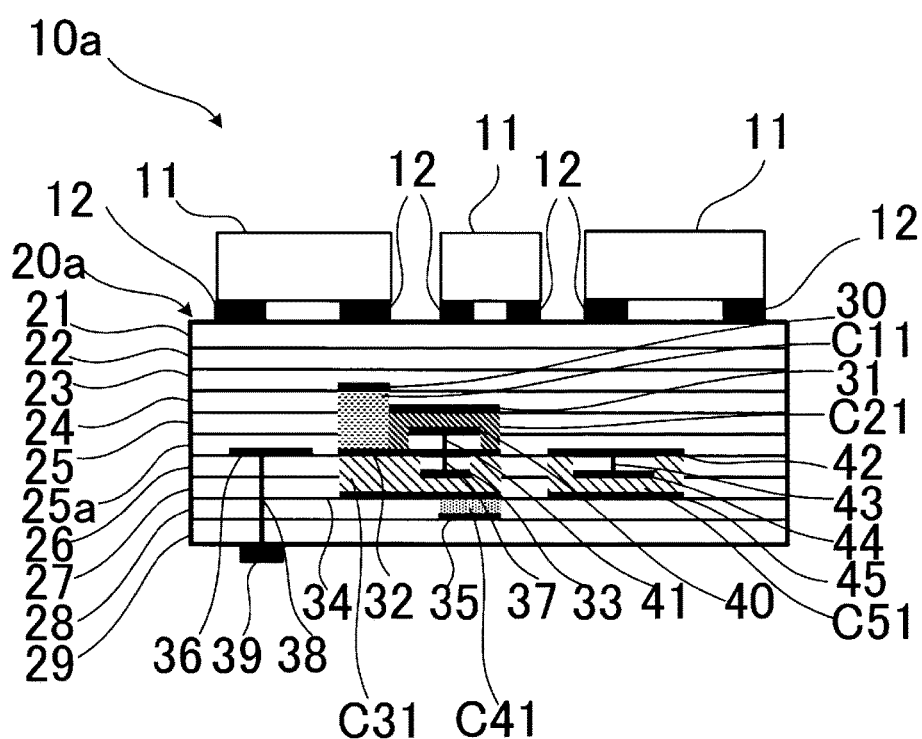
FIG. 2 is a cross-sectional view of a circuit module according to a second preferred embodiment of the present invention.

The configuration of a circuit module according to the second preferred embodiment of the present invention is illustrated in FIG. 2. FIG. 2 is a cross-sectional view of a circuit module 10a. Similarly to the first preferred embodiment, only electrode patterns related to a characteristic structure are illustrated, and the illustration of the other electrode patterns is omitted. Referring to FIG. 2, the same reference numerals are used to identify elements already described with reference to FIG. 1, and the description thereof will be therefore omitted.

In this preferred embodiment, the capacitor electrodes 31 and 32 face each other so that the dielectric layer 25 and a dielectric layer 25a are sandwiched therebetween. On the surface of the dielectric layer 25a, an auxiliary electrode 40 is provided. The auxiliary electrode 40 is electrically connected to the capacitor electrode 32 via a via electrode 41. The auxiliary electrode 40 is arranged in an area in which the capacitor electrodes 31 and 32 face each other as viewed from the lamination direction. Each of the capacitor electrode 32 and the auxiliary electrode 40 faces the capacitor electrode 31, so that the capacitor C21 (a dark shaded portion in FIG. 2) is provided.

On the surface of the dielectric layer 26, a capacitor electrode 42 is arranged close to the capacitor electrode 32. On the surface of the dielectric layer 28, a capacitor electrode 45 is arranged close to the capacitor electrode 34. The capacitor electrodes 42 and 32 are capacitively coupled to each other in the in-plane direction of a dielectric layer, and the capacitor electrodes 45 and 34 are capacitively coupled to each other in the in-plane direction of another dielectric layer.

The capacitor electrode 42 is connected to an auxiliary electrode 44 provided on the dielectric layer 27 via a via electrode 43 passing through the dielectric layer 26. Each of the capacitor electrode 42 and the auxiliary electrode 44 faces the capacitor electrode 45, so that a capacitor C51 (a lightly shaded portion in FIG. 2) is provided.

Thus, for the capacitor electrode 32, the via electrodes 37 and 41 that are connected in the lamination direction and the auxiliary electrodes 33 and 40 that are connected to the via electrodes 37 and 41, respectively, are provided. Accordingly, the values of the capacitors C21 and C31, which include the capacitor electrode 32, can be adjusted independently of the other circuit elements.

In addition, for the capacitor electrode 42 of the capacitor C51, the via electrode 43 and the auxiliary electrode 44 connected to the via electrode 43 are provided. Accordingly, despite the fact that the capacitor electrodes 32 and 42 are close to each other on the same dielectric layer and the capacitor electrodes 34 and 45 are close to each other on the same dielectric layer, the value of the capacitor C51 can be independently adjusted without changing the state of coupling between the capacitor electrodes 32 and 42 and the state of coupling between the capacitor electrodes 34 and 45.

Third Preferred Embodiment

Figure 3:
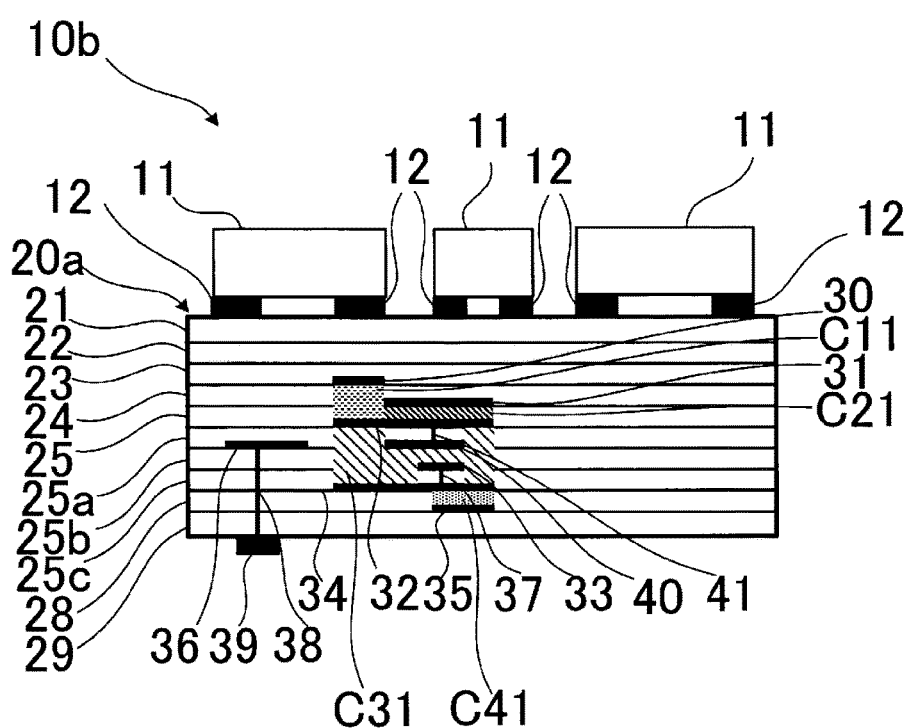
FIG. 3 is a cross-sectional view of a circuit module according to a third preferred embodiment of the present invention.
Figure 4:
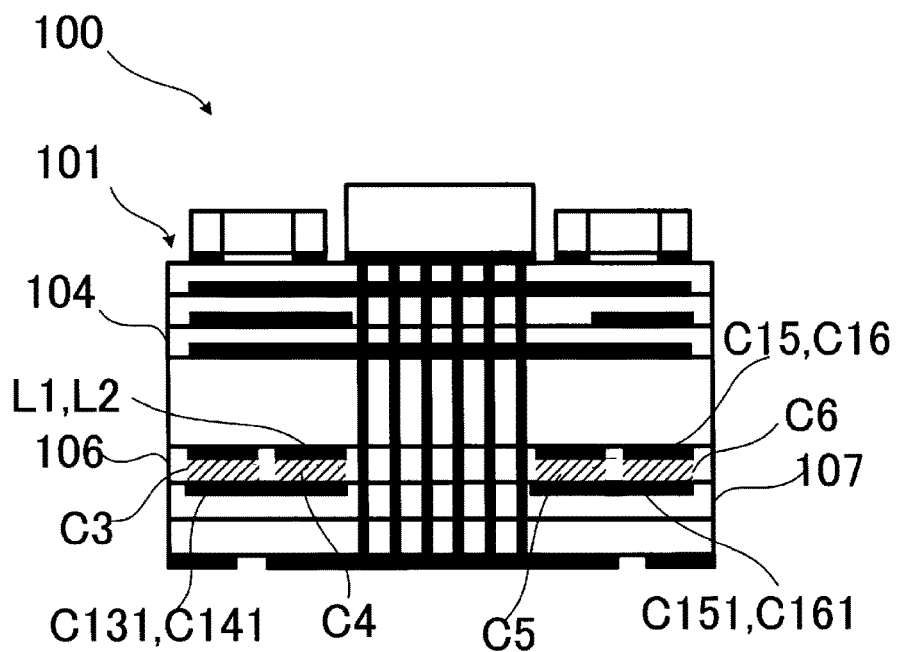
FIG. 4 is a cross-sectional view of a circuit module in the related art.
Figure 5:
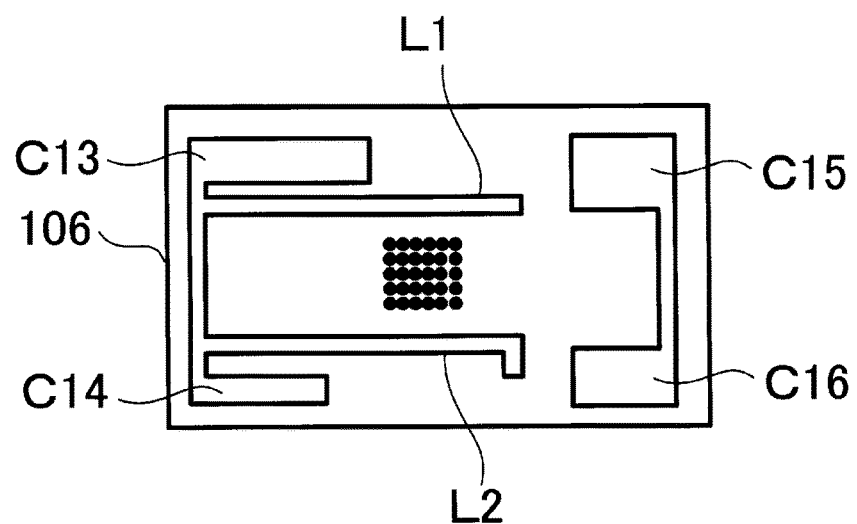
FIG. 5 is a plan view of a functional layer 106 in the circuit module in the related art.
Figure 6:
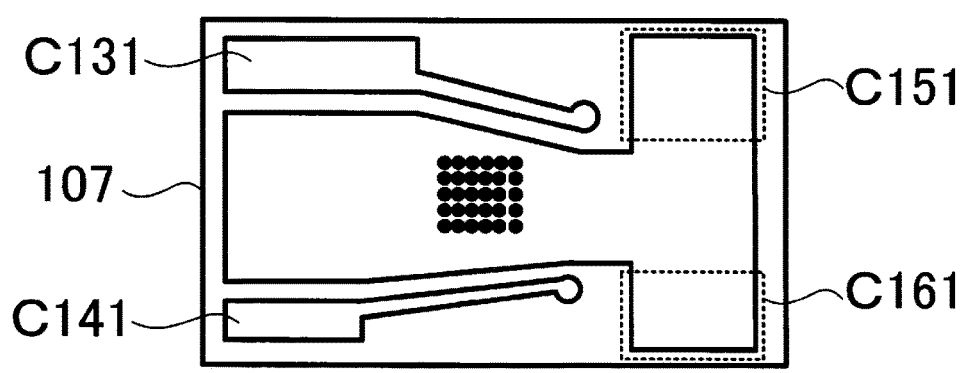
FIG. 6 is a plan view of a functional layer 107 in the circuit module in the related art.
Figure 7A:
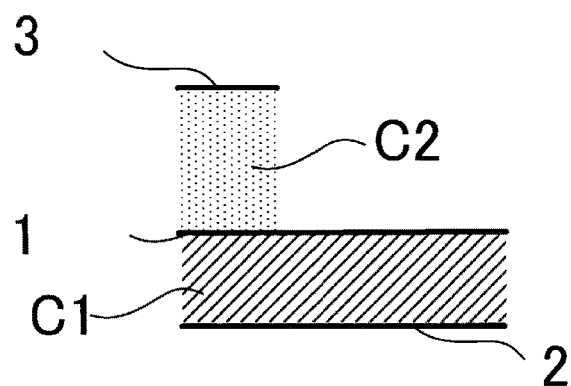
FIGS. 7A and 7B are conceptual diagrams illustrating a capacitance value changing method in the related art.
Figure 7B:
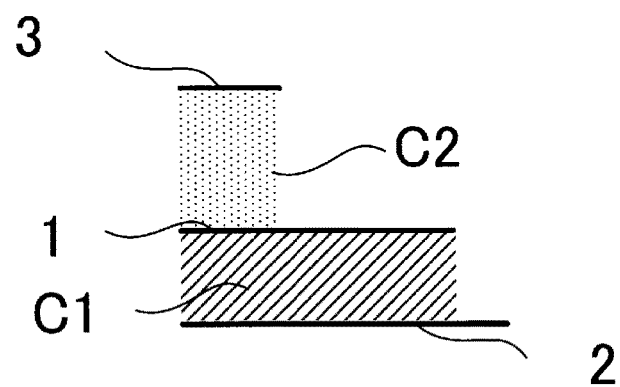

The configuration of a circuit module according to the third preferred embodiment of the present invention is illustrated in FIG. 3. FIG. 3 is a cross-sectional view of a circuit module 10b. Similarly to the first preferred embodiment, only electrode patterns related to a characteristic structure are illustrated, and the illustration of the other electrode patterns is omitted. Referring to FIG. 3, the same reference numerals are used to identify elements already described with reference to FIG. 1, and the description thereof will be therefore omitted.

In this preferred embodiment, the capacitor electrodes 32 and 34 face each other so that the dielectric layer 25a and dielectric layers 25b and 25c are sandwiched therebetween. On the dielectric layer 25b, the auxiliary electrode 40 is provided. The auxiliary electrode 40 is connected to the capacitor electrode 32 via the via electrode 41 passing through the dielectric layer 25a. On the surface of the dielectric layer 25c, the auxiliary electrode 33 is provided. The auxiliary electrode 33 is connected to the capacitor electrode 34 via the via electrode 37 passing through the dielectric layer 25c. The auxiliary electrodes 33 and 40 are arranged in an area in which the capacitor electrodes 32 and 34 face each other as viewed from the lamination direction. Thus, each of the capacitor electrode 32 and the auxiliary electrode 40 faces the capacitor electrode 34 and the auxiliary electrode 33, so that the capacitor C31 (a lightly shaded portion in FIG. 2) is provided.

In this preferred embodiment, between the capacitor electrodes 32 and 34 of the capacitor C31, the auxiliary electrodes 33 and 40 are provided. Accordingly, in order to adjust the capacitance value of the capacitor C31, the area of the auxiliary electrode 33 or 40 is changed or the thicknesses of the dielectric layers 25a, 25b, and 25c are changed while maintaining the distance between the capacitor electrodes 32 and 34.

Thus, the value of the capacitor C31 can be adjusted without changing the area of the capacitor electrode 32 or 34 and the position of the capacitor electrode 32 or 24 in the lamination direction. Accordingly, the value of the capacitor C31 can be adjusted independently of the values of the capacitors C11 and C21 including the capacitor electrode 32 and the value of the capacitor C41 including the capacitor electrode 34. Since the area of the capacitor electrode 32 or 34 and the position of the capacitor electrode 32 or 34 in the lamination direction are not changed, the state of capacitive coupling between the capacitor electrode and the inductor electrode 36 is not changed.

By arranging a plurality of auxiliary capacitor electrodes between capacitors defining a single capacitor, the adjustable range of a capacitance value is increased. As a result, design flexibility is increased, and fine adjustment of a capacitance value can be performed.

Other Preferred Embodiments

A substrate including built-in capacitors according to the present invention is not limited to the above-described preferred embodiments, and can be variously configured within the scope of the present invention.

For example, in the above-described preferred embodiments of the present invention, a via electrode and an auxiliary electrode are preferably arranged so that they are connected to a capacitor electrode with which a capacitor is defined. However, only the via electrode may be provided, and the capacitance value of the capacitor may be adjusted with the via electrode. In this case, a plurality of via electrodes may be provided. The connection between electrode patterns in a substrate may be changed so as to allow a capacitor electrode to function as a ground electrode.

In the first preferred embodiment of the present invention, a via electrode and an auxiliary electrode are preferably connected to the capacitor electrode 32. However, the via electrode and the auxiliary electrode may be connected to the capacitor electrode 34.

In the third preferred embodiment of the present invention, a via electrode and an auxiliary electrode are preferably connected to the capacitor electrode 32, and another via electrode and another auxiliary electrode are preferably connected to the capacitor electrode 34. However, for only one of the capacitor electrodes 32 and 34, a via electrode and an auxiliary electrode may be provided. The number of auxiliary electrodes may be two or more.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit module comprising:
a multilayer substrate including at least one built-in capacitor, a plurality of dielectric layers, and a plurality of capacitor electrodes, the plurality of dielectric layers and the plurality of capacitor electrodes being laminated to one another; wherein
a via electrode is provided between a pair of the plurality of capacitor electrodes defining the at least one built-in capacitor;
the via electrode extends from one of the pair of the plurality of capacitor electrodes defining the at least one built-in capacitor toward the other one of the pair of the plurality of capacitor electrodes;
an auxiliary electrode is provided entirely within an area in which the pair of the plurality of capacitor electrodes overlap each other as viewed from a direction in which the plurality of dielectric layers and the plurality of capacitor electrodes are laminated;
the auxiliary electrode and the via electrode are connected to each other;
the auxiliary electrode is connected to the one of the pair of the plurality of capacitor electrodes defining the at least one built-in capacitor to independently adjust a capacitance value of the at least one built-in capacitor;
only one auxiliary electrode having a same electric potential as the one of the pair of the plurality of capacitor electrodes is provided between the pair of the plurality of capacitor electrodes;
the capacitance value of the at least one built-in capacitor is defined by only capacitances that are generated between the pair of the plurality of capacitor electrodes;
a capacitor is formed directly between the pair of the plurality of capacitor electrodes in an area that the auxiliary electrode does not overlap;
the at least one built-in capacitor is a capacitor group of at least two capacitors defined by at least three of the plurality of capacitor electrodes; and
adjacent ones of the at least two capacitors in the capacitor group share one of the plurality of capacitor electrodes.

2. The circuit module according to claim 1, wherein, for the at least three of the plurality of capacitor electrodes of the capacitor group, a plurality of the via electrodes or a plurality of the auxiliary electrodes connected to the via electrodes are provided.

3. The circuit module according to claim 1, wherein a circuit element other than the at least one capacitor is provided on at least one of the plurality of dielectric layers.

4. The circuit module according to claim 1, wherein the plurality of dielectric layers are made of ceramic.

5. The circuit module according to claim 1, wherein the multilayer substrate further includes an inductor electrode which defines a portion of an inductor.

6. The circuit module according to claim 5, wherein the inductor electrode is coupled to one of the plurality of capacitor electrodes which is arranged adjacent to the inductor electrode.

7. The circuit module according to claim 1, further comprising an external component mounted on the multilayer substrate.

8. The circuit module according to claim 1, wherein the multilayer substrate is made of ceramic.

* * * * *